(12) United States Patent
Kim et al.

(10) Patent No.: US 7,540,635 B2
(45) Date of Patent: Jun. 2, 2009

(54) LED LIGHT SOURCE LENS HAVING UPPER, CENTRAL AND LOWER PARTS

(75) Inventors: Jin Jong Kim, Suwon-si (KR); Bum Jin Kim, Suwon-si (KR); Ho Seop Jeong, Seongnam-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 171 days.

(21) Appl. No.: 11/500,362

(22) Filed: Aug. 8, 2006

(65) Prior Publication Data
US 2007/0041098 A1 Feb. 22, 2007

(30) Foreign Application Priority Data
Aug. 18, 2005 (KR) .............. 10-2005-0075827

(51) Int. Cl.
*F21V 5/00* (2006.01)
(52) U.S. Cl. .............. 362/327; 362/308; 362/309; 362/332; 362/336; 362/337; 362/338; 362/340
(58) Field of Classification Search .............. 362/308, 362/309, 327, 332, 336–338, 340
See application file for complete search history.

(56) References Cited

U.S. PATENT DOCUMENTS

| 6,679,621 B2 | 1/2004 | West et al. | |
| 7,254,309 B1 * | 8/2007 | Chou et al. | 385/146 |
| 2003/0235050 A1 * | 12/2003 | West et al. | 362/327 |
| 2007/0030572 A1 * | 2/2007 | Lee et al. | 359/642 |

* cited by examiner

Primary Examiner—Sandra L O'Shea
Assistant Examiner—Meghan K Dunwiddie
(74) Attorney, Agent, or Firm—McDermott Will & Emery LLP

(57) ABSTRACT

Disclosed herein is a Light Emitting Diode (LED) light source lens for emitting light in a lateral direction. The LED source lens includes an upper part, an upper part and a central part. The upper part includes an upper part reflecting surface bent symmetrically with respect to the central axis of the lens, and an upper part refracting surface extended from the end of the upper part reflecting surface parallel with the central axis. The central part includes a side surface extended from the lower end of the upper part refracting surface and bend inwards, and refracts or reflects light through the side surface. The lower part accommodates the LED light source, and includes an arch-shaped lower part refracting surface extended outwards from the lower end of the side surface of the central part. The light radiated from the LED light source is emitted perpendicular to the central axis.

9 Claims, 4 Drawing Sheets

LED LIGHT SOURCE LENS HAVING UPPER, CENTRAL AND LOWER PARTS

CROSS-REFERENCE TO RELATED APPLICATIONS

U.S. Pat. No. 6,679,621 B1 is an application related to the present invention, and is incorporated by reference herein.

BACKGROUND OF THE INVENTION

1. Field of the Invention

The present invention relates, generally, to a light emitting device light source lens having upper, central and lower parts, and, more particularly, to a light emitting device light source lens having upper, central and lower parts that includes a structure for causing total internal reflections and refraction in light paths extending from the lower part to the upper part, thereby efficiently transmitting light through a side surface.

2. Description of the Related Art

Display and illumination optical systems require light sources that are environment-friendly and have high efficiency and long life spans. Furthermore, with the increase of the efficiency and luminance of Light Emitting Diodes (LEDs), alternative light sources using LEDs have been developed. In particular, as projects such as the development of environment-friendly televisions have been announced, the research and development of Liquid Crystal Devices (LCDs) using LED light sources have been further promoted. In order to meet such technical demand, the need for efficiently shaped LED light source lenses for display and illumination light sources is further increasing.

U.S. Pat. No. 6,679,621 B1 discloses a side emitting LED and the lens thereof. In detail, the patent discloses a lens structure that includes a reflecting surface and refracting surfaces and, thereby, allows light to be emitted from the LED through the side surface of the lens. The lens will be described with reference to FIG. 1 below.

Referring to FIG. 1, a prior art side emitting lens 100 includes an upper part 10 and a lower part 30. The upper part includes a reflecting surface 12 bent symmetrically about the central axis 40 of the lens, and a first refracting surface 14 extended from the end of the reflecting surface at an angle of inclination with respect to the central axis 40. The lower part includes a second refracting surface 32 arcuately extended from the lower end of the first refracting surface 14 to a bottom surface 34.

The light paths based on the prior art side emitting lens 100 are described in the following. Light emitted from an LED light source located at the focal point 50 of the lens 100 can enter the lens through the bottom surface 34 of the lens. Light directly incident on the reflecting surface 12 of the upper part 10 is radiated from the focal point 50, is reflected from the reflecting surface 12 of the upper part 10 to the first refracting surface 14, is refracted at the first refracting surface 14, and is emitted perpendicular to the central axis 40 of the lens (refer to the arrow L1).

Furthermore, light directly incident on the second refracting surface 34 is radiated from the LED light source located at the focal point 50, is refracted by the second refracting surface 34, and is emitted perpendicular to the central axis 40 of the lens (refer to the arrow L2).

As described above, the prior art side emitting lens is characterized in that most of the light is emitted through the first and second refracting surfaces of the lens, so that light radiated from the LED light source is emitted through the side surfaces of the lens.

However, the prior art side emitting lens is problematic in that the end of the reflecting surface of the upper part is sharp, so that light radiated from the LED light source is radiated onto a screen through the sharp portion of the reflecting surface, and it is difficult for light incident on the reflecting surface of the upper part (in particular, a portion of the reflecting surface adjacent to the end thereof) to propagate along a correct light path.

Furthermore, since the end of the reflecting surface of the upper part is sharp, there is concern about deformation due to breakage or damage at the time of mass production. When the lens is deformed, the deformed portion of the lens is located adjacent to a screen, so that the screen may be damaged by the deformed portion.

Meanwhile, the second refracting surface of the lower part functions to minimize the amount of light propagating to the upper part and emit light to the side surface. Since the second refracting surface has a wider area than does the first refracting surface, variation in the curvature of a surface must be high in order to emit light from the second refracting surface at a desired angle, thereby causing the problem of increasing the amount of light confined inside the lens.

SUMMARY OF THE INVENTION

Accordingly, the present invention has been made keeping in mind the above problems occurring in the prior art, and an object of the present invention is to provide an LED light source lens, in which a refracting surface is formed to extend from the end of an upper part reflecting surface parallel with the central axis of the lens, thereby facilitating the manufacture of the lens, and in which an inclined surface is formed by bending the side surface of a central part connected to an upper part, so that light paths are changed, thereby emitting light through the side surface of the lens.

Another object of the present invention is to provide an LED light source lens, in which the maximum diameter of a lower part refracting surface is smaller than that of the upper part reflecting surface, thereby reducing the loss of light due to total internal reflections generated in a lower part.

In order to accomplish the above object, the present invention provides an LED light source lens for emitting light in a lateral direction, including an upper part including an upper part reflecting surface bent symmetrically with respect to the central axis of the lens, and an upper part refracting surface extended from the end of the upper part reflecting surface parallel with the central axis; a central part including a side surface extended from the lower end of the upper part refracting surface and bend inwards, and refracting or reflecting light through the side surface; and a lower part accommodating the LED light source, and including an arch-shaped lower part refracting surface extended outwards from the lower end of the side surface of the central part; wherein the light radiated from the LED light source is emitted perpendicular to the central axis.

Preferably, the lower part, the central part and the upper part are integrally injected.

Preferably, the bent side surface of the central part includes an inclined surface at least partially inclined inwards, and light is refracted or reflected through the inclined surface.

Preferably, the inclined surface has an upper end bent and extended to the lower end of the upper part refracting surface, and a lower end bent and extended to the lower part refracting surface.

Preferably, the lower part refracting surface has a maximum diameter that is smaller than the maximum diameter of the upper part reflecting surface.

Preferably, the inclined surface has an upper end bent and extended to the lower end of the upper part refracting surface, and a lower end extended directly to the lower part refracting surface.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
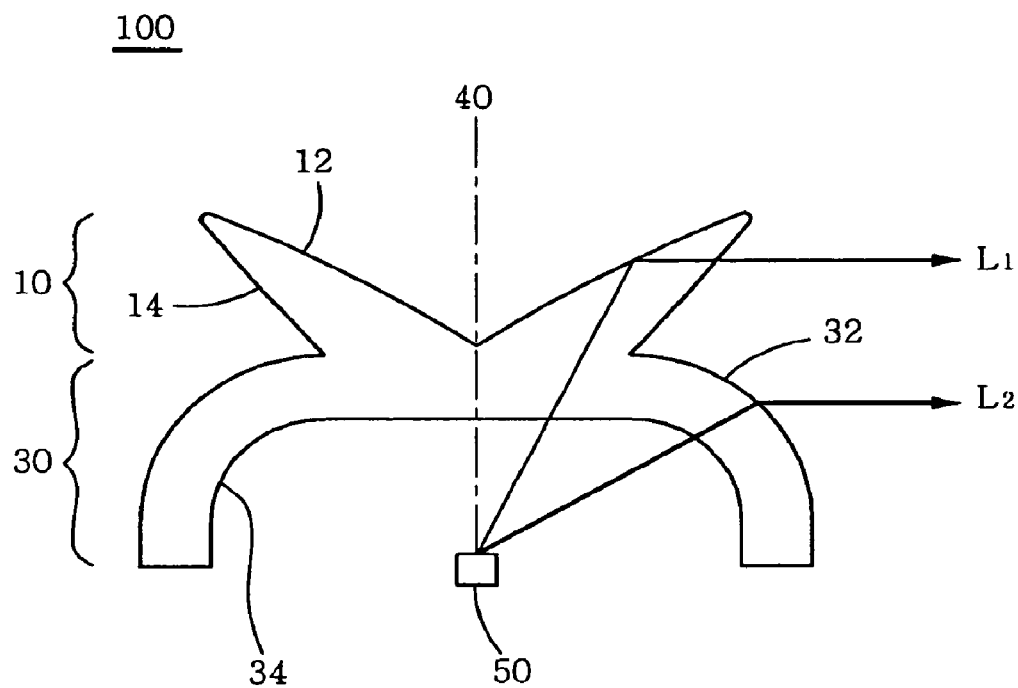
FIG. 1 is a sectional view showing an example of a prior art lens.

Reference now should be made to the drawings, in which the same reference numerals are used throughout the different drawings to designate the same or similar components.

With reference to the accompanying drawings, preferred embodiments of the present invention are described below.

Figure 2:
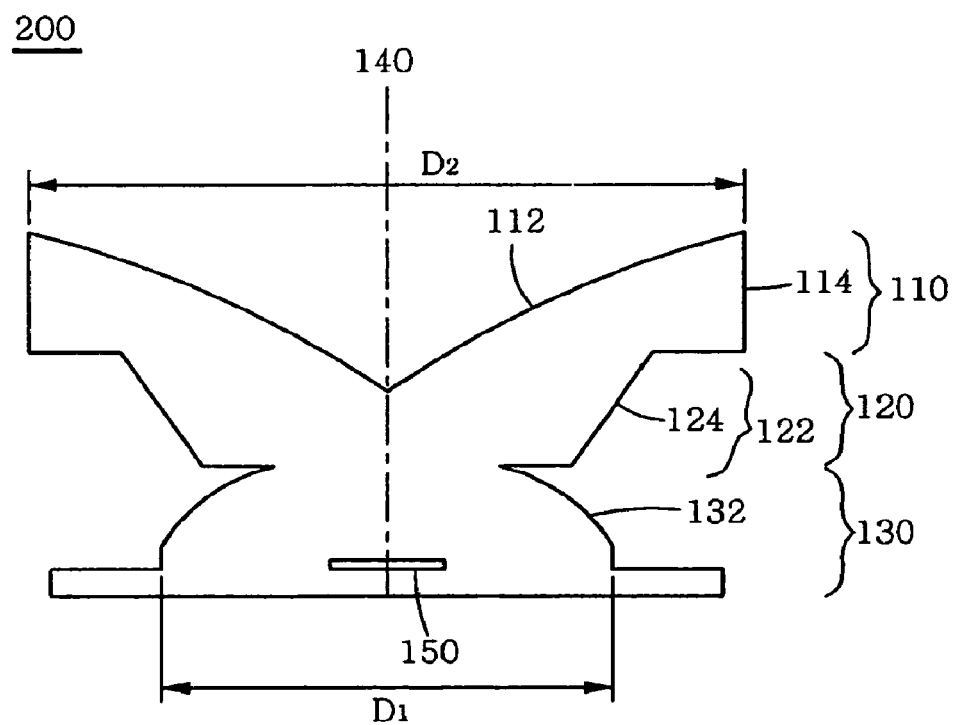
FIG. 2 is a sectional view showing an LED light source lens according to a first embodiment of the present invention.
Figure 3:
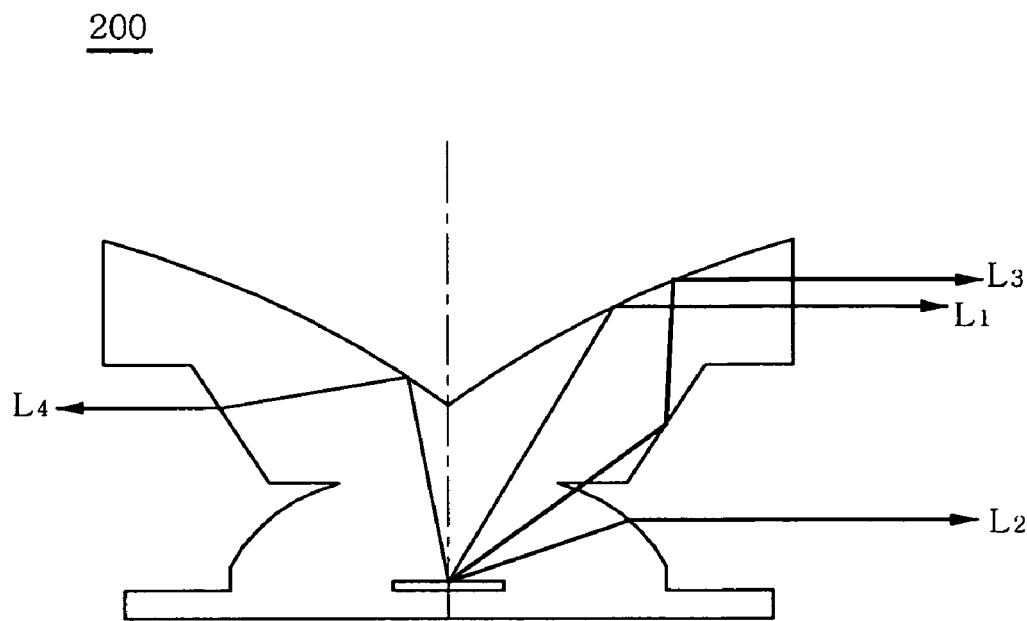
FIG. 3 is a diagram showing light paths through the LED light source lens of FIG. 2.

FIG. 2 is a sectional view showing an LED light source lens 200 according to a first embodiment of the present invention, and FIG. 3 is a diagram showing light paths through the LED light source lens 200 of FIG. 2.

The LED light source lens 200 according to the first embodiment of the present invention includes an upper part 110, a central part 120 and a lower part 130. The LED light source lens 200 is characterized in that the maximum diameter D1 of a lower part refracting surface 132 is designed to be smaller than the maximum diameter D2 of an upper part reflecting surface 112.

The upper part 110 includes the upper part reflecting surface 112 and the upper part refracting surface 114. The upper part reflecting surface 112 has a shape that is bent symmetrically with respect to a central axis 140, while the upper part refracting surface 114 is formed to extend from the end of the upper part reflecting surface 112 and to be parallel with the central axis 140 to a certain distance.

The central part 120 includes a side surface 122 extended from the lower end of the upper part refracting surface 114, and the side surface 122 includes an inclined surface 124 inclined radially inwards at a certain angle. Furthermore, the upper end of the inclined surface 124 is bent perpendicular to the central axis 140 and extends to the lower end of the upper part refracting surface 114, the lower end of the inclined surface 124 is bent perpendicular to the central axis 140 and extends to the lower part refracting surface 132, and light can be selectively reflected or refracted at the inclined surface 124. The reflection or refraction of light by the inclined surface 124 will be described in the following description of light paths.

The lower part 130 includes an arch-shaped lower part refracting surface 132 extending radially outwards from the lower end of the side surface 122 of the central part 120. An LED light source 150 for radiating light to the lens is accommodated in the lower portion of the lower part 130.

In general, reflection, which occurs at boundary surfaces (for example, the upper part reflecting surface and the inclined surface) formed by the material of the lens and air, includes total internal reflection, which occurs when the incident angle of light is larger than a critical angle. Furthermore, refraction occurs at other boundary surfaces (for example, the upper part refracting surface, the lower part refracting surface and the inclined surface) when the incident angle of light is smaller than the critical angle.

With respect to light paths according to the first embodiment of the present invention, light paths L1 and L2 are similar to those described in the document in which the prior art technology is described. In detail, light directly incident on the upper part reflecting surface 112 is radiated from the LED light source 150, is reflected by the upper part reflecting surface 112 to the upper part refracting surface 114, is refracted by the upper part refracting surface 114, and is emitted perpendicular to the central axis 140 of the lens (refer to the arrow L1). Alternatively, light is radiated from the LED light source 150, is directly incident on the lower part refracting surface 132, is refracted by the lower part refraction surface 132, and is emitted perpendicular to the central axis 140 (refer to the arrow L2).

With respect to other light paths, the part of the light that is radiated from the LED light source is passed through the lower part refracting surface 132 and directly enters the upper part 110, is refracted at the inclined surface 124 formed on the side surface 122 of the central part 120, is reflected at the upper part reflecting surface 112, and is emitted through the upper part refracting surface 114 (refer to the arrow L3). The part of the light that is radiated from the LED light source, is directly incident on the upper part reflecting surface 112, and does not reach the upper part refracting surface 114 even though it is reflected at the upper part reflecting surface 112 is refracted and emitted through an inclined surface 124 formed on the side surface 122 of the central part 120 (refer to the arrow L4).

As described above, the LED light source lens having a bent side surface according to the first embodiment of the present invention includes the upper part, the central part and the lower part. In particular, a side surface that is bent inwards and extends from the lower end of the upper part refracting surface and, then, is inclined may be provided. Accordingly, the part of the light that is radiated from the LED light source and is directly incident on the upper part through the lower part is reflected at the side inclined surface of the central part and is emitted via the upper part reflecting surface and the upper part refracting surface, thereby reducing erroneous light paths caused by the prior art technology.

Furthermore, the LED light source lens is manufactured and provided such that the maximum diameter of the lower part refracting surface is smaller than the maximum diameter of the upper part reflecting surface. Accordingly, most of the light is emitted through the upper part and the inclined surface of the central part, so that the loss of light due to total internal reflections in the lower part can be reduced.

Figure 4:
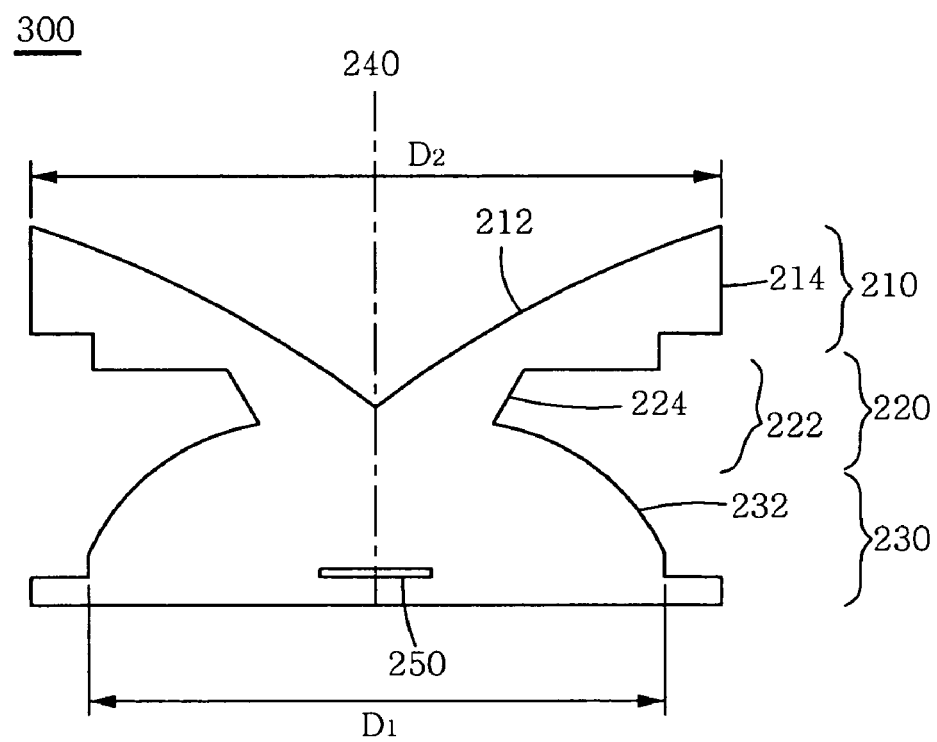
FIG. 4 is a sectional view showing an LED light source lens according to a second embodiment of the present invention.
Figure 5:
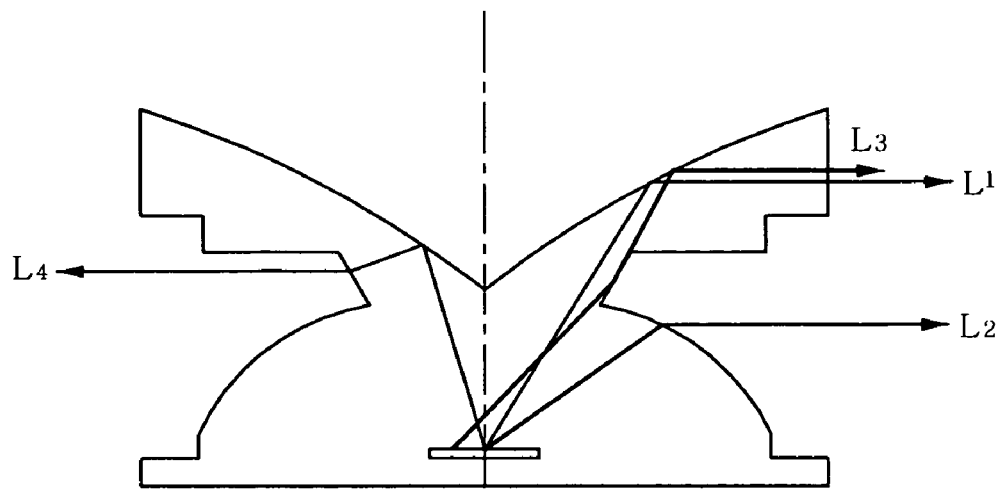
FIG. 5 is a diagram showing light paths through the LED light source lens of FIG. 4.

FIG. 4 is a sectional view showing an LED light source lens 300 according to a second embodiment of the present invention, and FIG. 5 is a diagram showing the light paths of the LED light source lens 300 of FIG. 4.

The LED light source lens 300 according to the second embodiment of the present invention, as shown in FIG. 2, includes an upper part 210, a central part 220 and a lower part 230. The LED light source lens 300 is characterized in that the lower end of the inclined surface 224 of the side surface 222 is directly connected to the lower part refracting surface 232 without bending and the region of the lower part 230 larger than that of the lower part of the first embodiment (refer to 130 of FIG. 2).

The upper part 210 includes an upper part reflecting surface 212 and an upper part refracting surface 214. The shapes of the upper part reflecting surface 212 and the upper part refracting surface 214 are the same as those described in conjunction with FIG. 2.

The central part 220 includes the side surface 222, and the side surface 222 includes an inclined surface 224 which is radially inwardly inclined at a certain angle. Furthermore, the upper end of the inclined surface 224 extends to the lower end of the upper part refracting surface 214 after being bent two times perpendicularly with respect to the central axis 240. The lower end of the inclined surface 224 is directly connected to the lower part refracting surface 232, which is radially outwardly curved from the central axis 240. Light can be reflected or refracted at the inclined surface 224.

The lower part 230 includes the arch-shaped lower part refracting surface 232 extending outwards from the lower end of the side surface 222 of the central part 220. An LED light source 250 for radiating light to the lens is accommodated in the lower part 230.

Of light paths according to the second embodiment of the present invention, light paths L1 and L2 are the same as those described in conjunction with the first embodiment. Light paths L3 and L4 are the same as those described in conjunction with FIG. 3.

As described above, the lens according to the second embodiment of the present invention is formed such that the lower end of the inclined surface 224 of the side surface 222 directly extends to the lower part refracting surface 232 and the lower part 230 is larger than the lower part of the first embodiment (refer to 130 of FIG. 2). As a result, the part of the light that is emitted through the upper part reflecting surface and the upper part refracting surface does not reach the upper part reflecting surface or the upper part refracting surface, but is directly refracted at and emitted from the lower part refracting surface.

Figure 6:
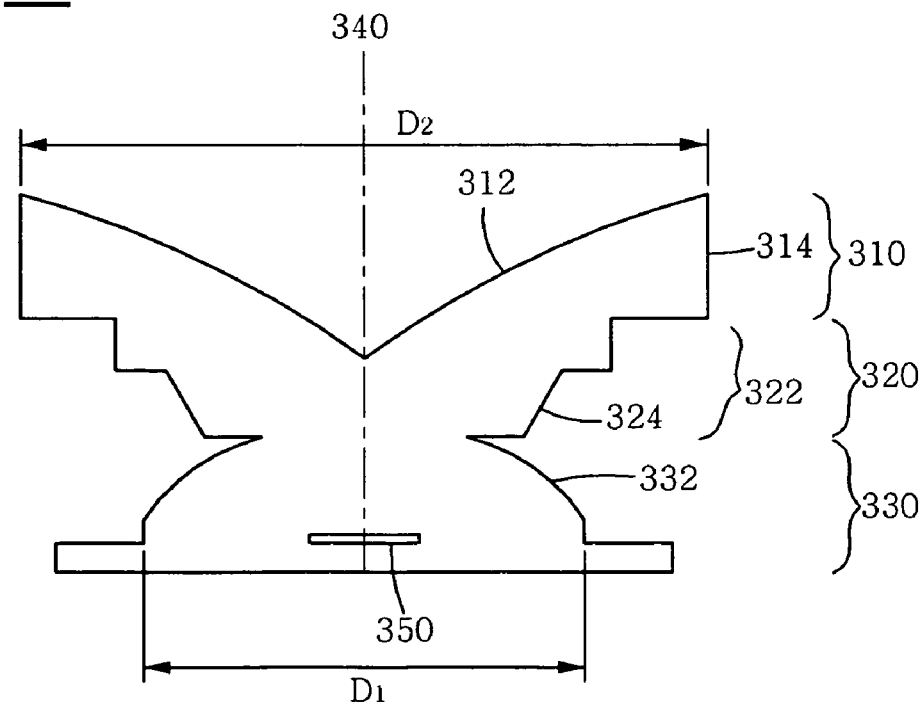
FIG. 6 is a sectional view showing an LED light source lens according to a third embodiment of the present invention.
Figure 7:
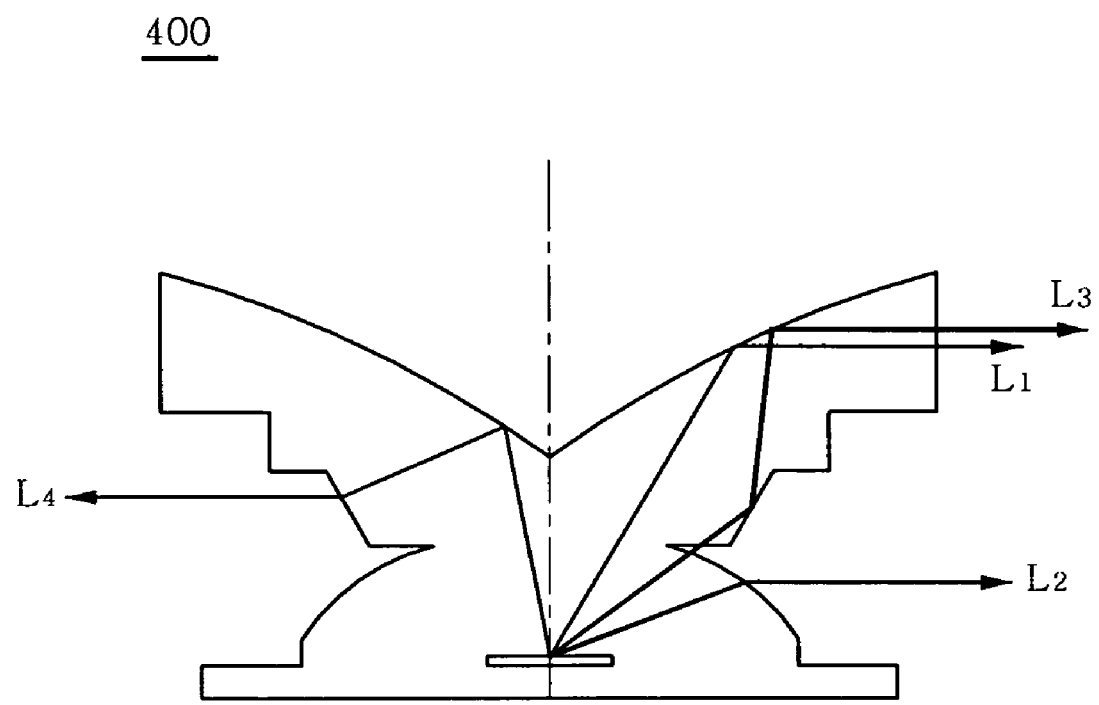
FIG. 7 is a diagram showing light paths through the LED light source lens of FIG. 6.

FIG. 6 is a sectional view showing an LED light source lens 400 according to a third embodiment of the present invention, and FIG. 7 is a diagram showing the light paths of the LED light source lens 400 of FIG. 6.

The LED light source lens 400 according to the third embodiment of the present invention includes an upper part 310, a central part 320 and a lower part 330. Compared with the second embodiment, the third embodiment is configured such that the lower part inclined surface 324 of the central part 320 is bent and then connected to the lower part refracting surface 332. Compared with the first embodiment, the third embodiment is characterized in that the upper end of the inclined surface 324 is bent two times and then connected to the lower end of the upper part refracting surface.

The upper part 310 includes an upper part reflecting surface 312 and an upper part refracting surface 314. The shapes of the upper part reflecting surface 312 and the upper part refracting surface 314 are the same as those described in conjunction with FIG. 2.

The central part 320 includes a side surface 322 extending from the lower end of the upper part refracting surface 314, and the side surface 322 includes an inclined surface 324 inclined radially inwards at a certain angle. Furthermore, the upper end of the inclined surface 324 extends to the lower end of the upper part refracting surface 314 perpendicularly with respect to the central axis 340 after being bent two times, and the lower end of the inclined surface 324 extends to the lower part refracting surface 332 perpendicularly with respect to the central axis 340. Light is selectively reflected and refracted at the inclined surface 324.

The lower part 330 includes an arch-shaped lower part refracting surface 332 outwardly extending from the lower end of the side surface 322 of the central part 320. An LED light source 350 for radiating light to the lens is accommodated in the lower part 330.

Light paths L1 and L2 according to the third embodiment of the present invention are similar to those described in the document in which the prior art technology is described. Light paths L3 and L4 are also similar to those described in conjunction with FIG. 3.

As described above, the LED light source lens having the bent side surface according to the present invention includes the upper part, the central part and the lower part. In particular, the lower end of the upper part refracting surface includes the side surface having the inclined surface that is inwardly bent and extended. Accordingly, part of light, which is radiated from the LED light source, passes through the lower part and directly enters the upper part, is reflected at the inclined surface of the central part and emitted through the upper part reflecting surface and the upper part refracting surface, thereby reducing erroneous light paths caused by the prior art technology.

Furthermore, the LED light source lens is configured and provided such that the maximum diameter of the lower part refracting surface is smaller than the maximum diameter of the upper part reflecting surface. As a result, most of light is emitted from the upper part and the inclined surface of the central part, so that the loss of light due to total internal reflections in the lower part can be reduced.

As described above, the present invention is characterized in that an LED light source lens, in which the upper part refracting surface is formed, the side surface is bent and at least a portion of the side surface forms the inwardly inclined surface, is provided and in that the light of the LED light source is efficiently emitted through the side surface of the lens without passing through erroneous paths.

As described above, although the LED light source lens of the present invention having the bent side surface has been described in conjunction with the preferred embodiments of the present invention, it is apparent to those skilled in the art that various corrections, variations and modifications of the present invention can be made without departing from the spirit of the present invention.

According to the LED light source lens of the present invention having upper, central and lower parts, the refracting surface extends from the end of the upper part reflecting surface parallel with the central axis, the side surface of the central part is bent and at least a portion of the side surface forms an inclined surface, so that light can be efficiently emitted through the side surface by changing erroneous light paths using the inclined surface, and the mass production of the LED light source lens is enabled.

Furthermore, the LED light source lens of the present invention can be manufactured such that the maximum diameter of the lower part refracting surface is smaller than the maximum diameter of the upper part reflecting surface, so that the loss of light due to total internal reflections in the lower part can be reduced.

What is claimed is:

1. A Light Emitting Device (LED) light source lens for emitting light in a lateral direction, comprising:
 an upper part including an upper part reflecting surface bending symmetrically with respect to a central axis of the lens, and an upper part refracting surface extending from an end of the upper part reflecting surface parallel with the central axis;

a central part including a side surface extending from a lower end of the upper part refracting surface and bending inwardly toward the central axis, and the light being selectively refracted or reflected through the side surface; and a lower part accommodating the LED light source, and including an arch-shaped lower part refracting surface extending outwards from a lower end of the side surface of the central part;

wherein the light radiated from the LED light source is emitted perpendicular to the central axis;

wherein the bent side surface of the central part comprises an inclined surface at least partially inclining inwardly toward the central axis, and the light is refracted or reflected through the inclined surface;

wherein the inclined surface has an upper end bending and extending to a lower end of the upper part refracting surface, and a lower end bending and extending to the lower part refracting surface;

wherein the upper end of the inclined surface extends outwardly perpendicular to the central axis, and the lower end of the inclined surface extends inwardly perpendicular to the central axis.

2. A Light Emitting Device (LED) light source lens for emitting light in a lateral direction, comprising:

an upper part including an upper part reflecting surface bending symmetrically with respect to a central axis of the lens, and an upper part refracting surface extending from an end of the upper part reflecting surface parallel with the central axis;

a central part including a side surface extending from a lower end of the upper part refracting surface and bending inwardly toward the central axis, and the light being selectively refracted or reflected through the side surface; and a lower part accommodating the LED light source, and including an arch-shaped lower part refracting surface extending outwards from a lower end of the side surface of the central part;

wherein the light radiated from the LED light source is emitted perpendicular to the central axis;

wherein the bent side surface of the central part comprises an inclined surface at least partially inclining inwardly toward the central axis, and the light is refracted or reflected through the inclined surface;

wherein the inclined surface has an upper end bending and extending to a lower end of the upper part refracting surface, and a lower end bending and extending to the lower part refracting surface;

wherein the upper end of the inclined surface is bent at least two times perpendicular to the central axis so that the upper end of the inclined surface extends outwardly like as stair-shape, and the lower end of the inclined surface extends inwardly perpendicular to the central axis.

3. A Light Emitting Device (LED) light source lens for emitting light in a lateral direction, comprising:

an upper part including an upper part reflecting surface bending symmetrically with respect to a central axis of the lens, and an upper part refracting surface extending from an end of the upper part reflecting surface parallel with the central axis;

a central part including a side surface extending from a lower end of the upper part refracting surface and bending inwardly toward the central axis and the light being selectively refracted or reflected through the side surface; and a lower part accommodating the LED light source, and including an arch-shaped lower part refracting surface extending outwards from a lower end of the side surface of the central part;

wherein the light radiated from the LED light source is emitted perpendicular to the central axis;

wherein the bent side surface of the central nail comprises an inclined surface at least partially inclining inwardly toward the central axis and the light is refracted or reflected through the inclined surface;

wherein the inclined surface has an upper end bent and extended to a lower end of the upper part refracting surface, and a lower end extended directly without bending to the lower part refracting surface;

wherein the upper end of the inclined surface is bent at least two times perpendicular to the central axis so that the upper end of the inclined surface extends outwardly like as stair-shape, and the lower end of the inclined surface extends directly without bending to the lower part refracting surface.

4. The LED light source lens as set forth in claim 1, wherein the lower part, the central part and the upper part are integrally injected.

5. The LED light source lens as set forth in claim 1, wherein the lower part refracting surface has a maximum diameter that is smaller than a maximum diameter of the upper part reflecting surface.

6. The LED light source lens as set forth in claim 2, wherein the lower part, the central part and the upper part are integrally injected.

7. The LED light source lens as set forth in claim 2, wherein the lower part refracting surface has a maximum diameter that is smaller than a maximum diameter of the upper part reflecting surface.

8. The LED light source lens as set forth in claim 3, wherein the lower part, the central part and the upper part are integrally injected.

9. The LED light source lens as set forth in claim 3, wherein the lower part refracting surface has a maximum diameter that is smaller than a maximum diameter of the upper part reflecting surface.

* * * * *